United States Patent [19]

Bloxam

[11] 4,207,517
[45] Jun. 10, 1980

[54] SWITCHLESS D.C. MULTIFUNCTION TESTER

[76] Inventor: James M. Bloxam, 133 Skyline Dr., St. Paul, Minn. 55110

[21] Appl. No.: 958,377

[22] Filed: Nov. 7, 1978

Related U.S. Application Data

[63] Continuation of Ser. No. 807,820, Jun. 20, 1977, abandoned.

[51] Int. Cl.² .................... G01R 31/02; G01R 19/16; G01R 15/12
[52] U.S. Cl. ........................................ 324/51; 324/133
[58] Field of Search .................. 324/51, 53, 72.5, 133, 324/149, 73

[56] References Cited

U.S. PATENT DOCUMENTS

| | | | |
|---|---|---|---|
| 2,794,167 | 5/1957 | Jones | 324/53 |
| 2,851,659 | 9/1958 | Ladrick | 324/51 X |
| 3,870,950 | 3/1975 | Laass | 324/133 X |
| 3,934,195 | 1/1976 | Shires | 324/72.5 |
| 3,962,630 | 6/1976 | Chaffee | 324/133 X |
| 3,967,257 | 6/1976 | Hager | 324/51 U X |
| 4,007,418 | 2/1977 | Hanna | 324/133 X |
| 4,011,508 | 3/1977 | Gabor | 324/51 X |

FOREIGN PATENT DOCUMENTS

| | | | |
|---|---|---|---|
| 180330 | 5/1954 | Austria | 324/53 |
| 2060884 | 6/1972 | Fed. Rep. of Germany | 324/133 |
| 1210441 | 3/1960 | France | 324/133 |

OTHER PUBLICATIONS

Todd, *A Sub-Ohm Continuity Tester*, Electronics World, Feb. 1969, pp. 78–80.

*Primary Examiner*—Gerard R. Strecker
*Attorney, Agent, or Firm*—Merchant, Gould, Smith, Edell, Welter & Schmidt

[57] ABSTRACT

A self-contained hand-held portable pocket probe for trouble shooting direct current electrical systems. The probe includes an electrically conductive probe, a ground terminal, and first and second electrical circuits connected in parallel between the probe and ground terminal. The first electrical circuit includes an illumination device, a rectifying device, and a device for limiting current flow through the illumination device. The first electrical circuit normally enables positive current flow only in the direction from the probe to the ground terminal. The second electrical circuit normally allows current flow in a direction from the ground terminal to the probe and includes an illumination device, a rectifying device and a battery. The probe is designed for use with direct current systems having maximum test voltages in the range of 6–24 volts and for measurement of low impedance grounds.

13 Claims, 3 Drawing Figures

SWITCHLESS D.C. MULTIFUNCTION TESTER

This is a continuation of application Ser. No. 807,820, filed June 20, 1977, now abandoned.

BACKGROUND OF THE INVENTION

This invention relates generally to electronic test equipment, and more particularly to a self-contained hand-held electronic test probe for trouble shooting DC electrical systems having maximum test voltages in the range of 6–24 volts.

In trouble shooting DC electrical systems, in particular automotive type systems, it is desirable to have an easy to use portable hand-held probe which includes a probe member for making electrical contact at selected points throughout the electrical system under inspection and which also has a visual indicator which provides an immediate indication of the signal received by the probe member. With the visual indication capability as a part of the self-contained hand-held probe, an operator can rapidly test the electrical system without having his attention diverted from the system by the necessity of referring to a remotely located indicator or panel. It is also desirable to have a self-contained probe which has its own source of power such that external power supplies are unnecessary. Additionally, it is desirable to have a probe that will provide an indication of ground potential only for low impedance ground (i.e., typically less than 100 ohms), since high impedance grounds are particularly detrimental in automotive electrical systems.

Test probes having one or more of these features are known in the prior art. However, most prior art test probes include a plurality of indicator lamps in a hand-held probe unit for indicating positive or negative voltage and which operate such that both indicator lamps are normally illuminated, and wherein one of the lamps is extinguished when a particular voltage signal is received by the probe. In the operation of such devices, both of the visual indicators must be illuminated throughout substantially the entire test procedure, thus reducing the operative life of the probe and making such circuit construction generally impractical for use in self-contained battery powered probes. Additionally, in some such devices, substantially all of the measured voltage is applied across the appropriate visual indicator subjecting the indicator to severe transient conditions, thus further reducing their operative life. Several of the prior art test probes incorporate transistor components having input impedances on the order of 5000 ohms. Thus, grounds having impedances as high as a few hundred ohms will provide an indication of a "good" ground when, in fact, the ground would be unacceptable in an automotive electrical system.

In the prior art test probes which included self-contained batteries for energizing the test circuits, the devices are generally limited in their application and have significant non-operative current drains requiring frequent maintenance and replacement of the batteries.

The inventor of the present invention in a previous application, Ser. No. 642,077, filed Dec. 18, 1975, now U.S. Pat. No. 4,028,621 disclosed an inexpensive and easy to use test probe that incorporated a unique circuit design for maximizing reliability and life of the individual probe components. The applicant's previous disclosure, however, is designed solely for electrical systems having a single predetermined DC voltage level. Additionally, the inventor's prior test probe required the use of an external source of power, typically the battery of the automobile. Due to the circuit construction of the inventor's prior probe structure, that test probe could not be used for testing DC electrical systems having widely varying test voltage ranges, such as tractors or airplanes having dual voltage (i.e., 12/24 volts) systems as well as the 6 volt systems of older models of farm tractors and motorcycles. Additionally, the inventor's previous test probe cannot be used to check the electrical systems of vehicles which do not have an operating battery since an external source of power is required.

The present invention eliminates these disadvantages of the prior art in that it includes a self-contained hand-held pocket probe capable of testing DC electrical systems over a wide range of maximum voltages (i.e., 6 volts to 24 volts) and is capable of measuring relatively low-impedance ground connections. The test probe of the present invention incorporates electrical circuits which limit the maximum current through the probe illumination devices, thereby extending the reliability and operating life of the probe. Additionally, the quiescent current drain on the self-contained battery of the probe is minimal such that the life of the batteries utilized is maximized, requiring low maintenance and less frequent replacement. The probe is sized to be easily carried within the shirt pocket of the user and incorporates a single elongated flexible conductor extending therefrom for electrical connection to a known ground potential of the circuit being tested.

While particular probe housing and ground connector configurations will be disclosed, it is understood that other configurations could equally well be employed within the spirit and scope of the present invention. Further, while specific values of the circuit elements are disclosed with respect to the preferred embodiments of the electrical circuitry of the present invention, it is apparent that an operatively equivalent test probe circuit could be designed using somewhat different component values for the inventive circuit configurations disclosed herein.

SUMMARY OF THE INVENTION

The present invention is a self-contained hand-held portable pocket probe for trouble shooting of DC electrical systems and includes an electrically conductive probe and a ground terminal. A first electrical circuit is connected between the probe and the ground terminal and includes an illumination device, a rectifying device, and circuit means for limiting current flow through the illumination device. The first electrical circuit normally enables positive current flow only in the direction from the probe to the ground terminal. The probe of the present invention further includes a second electrical circuit connected between the probe and the ground terminal in parallel with the first electrical circuit and which normally enables positive current flow only in the direction from the ground terminal to the probe. The second electrical circuit further includes an illumination device, a rectifying device, and a battery.

In one embodiment of the invention, the current limiting means includes a plurality of serially connected diodes connected in parallel with the illumination device in the first electrical circuit. In an alternative embodiment of the invention, the current limiting means comprises a zener diode connected in parallel with the illumination device for enabling positive current flow only in a direction from the probe to the ground terminal.

In either embodiment of the invention, the illumination devices of the present invention are preferably light emitting diodes and the input impedance of the second electrical circuit is limited to a maximum of approximately 100 ohms whereby only low impedance grounds will activate the light emitting diode in the second electrical circuit.

Resistors are provided in both the first and second electrical circuits, the resistor in the second electrical circuit being selected in accordance with the maximum input impedance design parameters of the second electrical circuit. The current limiting means of the first electrical circuit limits the voltage applied across the light emitting diode thereby limiting the current flow therethrough for a wide range of maximum test voltages, in particular, for test voltages in the range of 6–24 volts. The difference between the test voltage at the probe and the voltage across the light emitting diode appears across a resistor in the first electrical circuit.

The present invention of a self-contained hand-held portable pocket probe further includes a ground clip for connection to a known ground potential in the circuit being tested and a flexible elongated insulated conductor which connects the ground clip to the ground terminal. The electrical circuitry of the present invention is housed within a pocket-sized housing having a pair of apertures through which the light emitting diodes are visible. The probe member may be releasably attached to the circuitry and it can be removed for storage within a chamber in the housing. Additionally, the flexible elongated electrical conductor may be retractable within the housing.

These and other advantages of my invention will become apparent with reference to the drawing, detailed description of the preferred embodiment, and claims.

DETAILED DESCRIPTION OF THE PREFERRED EMBODIMENT

Figure 1:
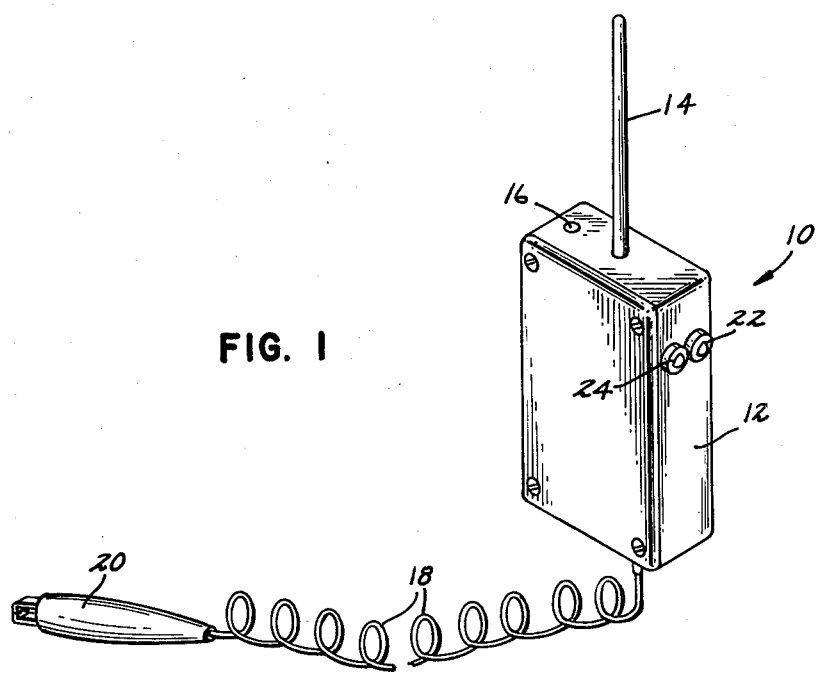
FIG. 1 is a view in perspective of the self-contained hand-held portable pocket probe of the present invention.

Referring to the drawing, wherein like numerals represent like parts throughout the several views, the pocket probe of the present invention is designated generally in FIG. 1 as 10. Pocket probe 10 includes a housing 12 sized so that probe 10 can be easily held in one hand by a user and additionally so that pocket probe 10 will fit within the shirt pocket of the user. An electrically conductive probe member 14 extends through an appropriately sized aperture in housing 12 and is connected within housing 12 to the circuitry of the present invention as will be described in more detail hereafter. In the preferred embodiment, probe member 14 is releasably connected to any conventional prior art terminal means within housing 12 such that when the pocket probe 10 is not in use probe member 14 can be disconnected from the probe circuitry and stored within a generally cylindrical storage chamber (not shown) within housing 12. An aperture 16 is provided in housing 12 through which probe member 14 is inserted into the storage chamber. An elongated flexible insulated conductor 18 extends from probe 10 through an aperture (not shown) in housing 12. An external ground connecting clip 20 is affixed to elongated flexible insulated conductor 18. Flexible insulated conductor 18 could be retractable to a stored position within housing 12. Housing 12 is further provided with a pair of apertures 22 and 24 therein through which a pair of light emitting diodes or other illumination means will be visible as described in more detail with respect to the circuitry of pocket probe 10.

Figure 2:
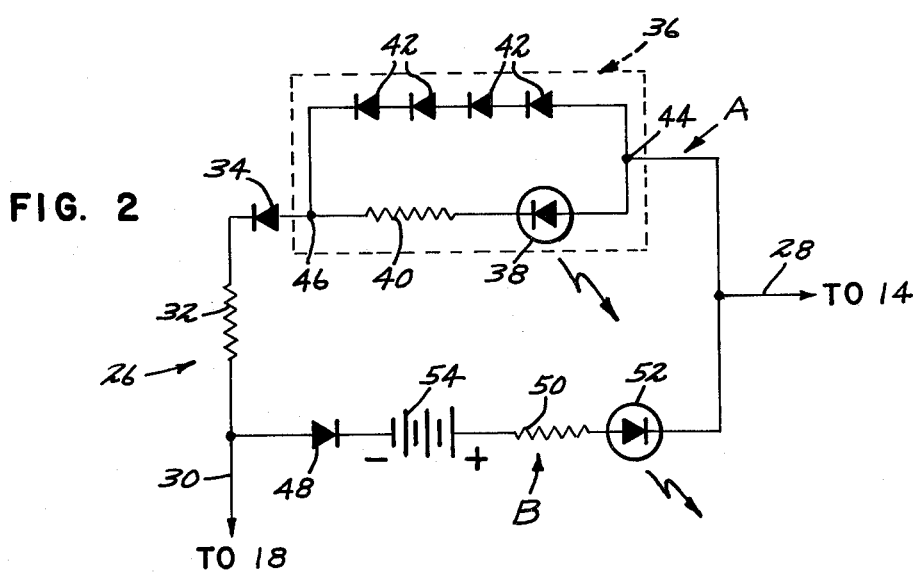
FIG. 2 is a schematic circuit diagram of the electrical components comprising one embodiment of the probe of FIG. 1.

One embodiment of the circuitry of pocket probe 10 is generally illustrated at 26 in FIG. 2. Probe circuit 26 includes a conductor 28 connected to probe member 14 and a ground conductor 30 which is connected to flexible insulated conductor 18. A pair of parallel circuit paths, indicated generally as A and B are connected between conductors 28 and 30. Electrical circuit A includes a resistor 32, a rectifying diode 34 and an indication circuit as shown within the dashed line enclosure 36 connected in series between conductor 28 and conductor 30. Indicator circuit 36 includes an illumination device 38, which in the preferred embodiment is a light emitting diode, and a resistor 40 connected in parallel with a plurality of serially connected diodes 42. Indicator circuit 36 has conductor junctions at 44 and 46. Rectifying diode 34, diodes 42, and light emitting diode 38 are connected for positive current flow only in the direction from conductor 28 to conductor 30.

Electrical circuit B includes a rectifying diode 48, a resistor 50, an illumination device 52, which in the preferred embodiment is also a light emitting diode, and a battery 54 connected in series between conductors 28 and 30. Rectifying diode 48 and light emitting diode 52 are connected such that positive current flow in electrical circuit B is only in a direction from conductor 30 to conductor 28. Diodes 34, 42 and 48 are preferrably silicon diodes having forward conduction breakdown of approximately 0.6 volts and which operate with a voltage thereacross in the range of 0.6–0.8 volts when in a forward current conduction mode. Light emitting diodes 38 and 52 are generally selected to have a forward conduction operating current in the range of 20–30 milliamps with a voltage drop of approximately 1.8 volts. An example of such light emitting diodes is a light emitting diode manufactured by the Tandy Corporation which has the model number 276-026. This light emitting diode is designed for usage at a maximum forward current of 50 milliamps and a maximum reverse voltage of 3 volts. At 20 milliamps light emitting diodes 38 and 52 have a maximum forward voltage drop of 2.3 volts. Resistors 32, 40 and 50 are typically selected to be 175 ohms, 30 ohms, and 10 ohms, respectively. Battery 54 is a 3 volt power source which may comprise two size AA batteries connected in series. It is to be understood that the above design parameters are typical but not limiting. However, for reasons that will be described in more detail hereafter, the input impedance of electrical circuit B is preferably not greater than 100 ohms.

Figure 3:
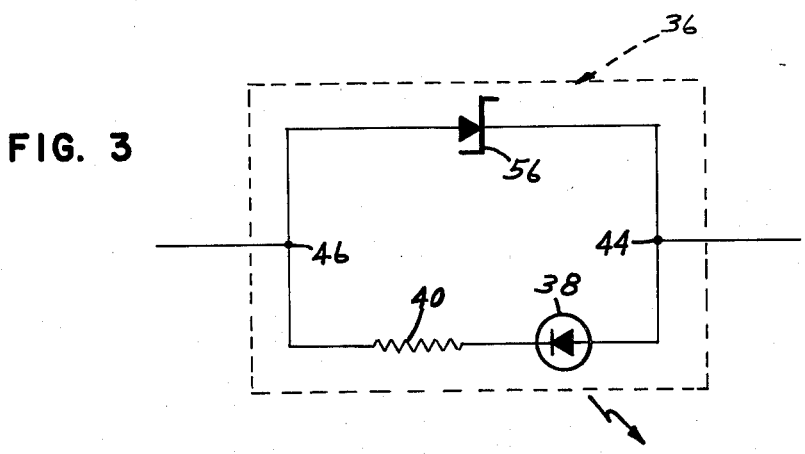
FIG. 3 is a schematic ciruit diagram of an alternative design of a portion of the circuit enclosed in dashed lines in FIG. 2.

FIG. 3 illustrates an alternative embodiment of indicator circuit 36. More particularly, in the alternative embodiment a zener diode 56 is connected between junctions 44 and 46 in parallel with the serially connected light emitting diode 38 and resistor 40. Zener diode 56 has a reverse breakdown at approximately 3.3 volts for conduction of positive current in a direction from junction 44 to junction 46. In this alternative embodiment, rectifying diodes 34 and 48 are selected to have similar design parameters as in the embodiment illustrated in FIG. 2. Resistor 32 may be approximately 100 ohms, while resistor 40 is selected to be approximately 40 ohms and resistor 50 may again be selected to be 10 ohms. Battery 54 is again chosen to provide a 3 volt source of DC power and may comprise two serially connected size AA batteries.

The operation of the present invention will now be described with particular reference to the embodiment illustrated in FIG. 2. In the quiescent or non-operating condition, a minimal leakage current is present in circuits A and B. With the design parameters as selected above, the quiescent current drain on the battery 54 is approximately 4 microamps. With the addition of another rectifying diode in series with diode 34, the leakage current can be reduced to approximately 1 microamp. With the quiescent leakage currents in the range of 1 to 4 microamps, battery 54 will be effective for a considerable length of time before it must be replaced.

In use, ground connecting clip 20 is attached to a portion of the circuit which is at a known ground potential. Elongate flexible insulated conductor 18 permits pocket probe 10 to be moved from one test location to another while clip 20 remains secured to the known ground potential or reference. Consider first, the circuit operation when probe 14 contacts a location having a positive potential. The pocket probe of the present invention is designed specifically for use in systems having maximum positive voltages in the range of 6 to 24 volts, for example, automotive, tractor, motorcycle, or airplane electrical systems. It can be seen that when probe 14 is connected to a positive potential of 6 volts or more, light emitting diode 52 and rectifying diode 48 are reverse biased such that no current will flow in electrical circuit B. On the other hand, rectifying diode 34, current limiting diodes 42, and light emitting diode 38 become forward biased for positive current flow in a direction from conductor 28 to conductor 30. Diodes 42 limit the voltage drop between junctions 44 and 46 to approximately 2.4 volts. Thus, the current through light emitting diode 38 will be limited to the range of 20 to 30 milliamps. At this current, light emitting diode 38 will generate a visual indication notifying the user that the probe is contacting a source of positive potential, or is "hot." The current through light emitting diode 38 remains substantially constant with positive potentials between 6 and 24 volts. The increased current in circuit A effected by larger positive test voltages is drawn through diodes 42 by-passing light emitting diode 38. A substantial portion of the postive test voltage is dropped across resistor 32.

In the alternative embodiment of indicator circuit 36, zener diode 56 serves the same function as diodes 42 of the embodiment illustrated in FIG. 2. Specifically, upon application of probe member 14 to a positive potential in the range of 6 to 24 volts, zener diode 56 will conduct positive current flow in a direction from junction 44 to junction 46. Zener diode 56 is selected to have the characteristics of approximately 3.3 volt drop thereacross during positive current flow from junction 44 to junction 46. The voltage drop across zener diode 56 remains essentially constant over a wide range of current. The embodiment of FIG. 3, therefore, is more effective in maintaining a constant voltage drop between junction 44 and 46 to limit the current through light emitting diode 38. As in the previous embodiment of FIG. 2, the increased current flow due to increased positive test voltages will flow substantially through zener diode 56 and a substantial portion of the positive test voltage is dropped across resistor 32.

Consider next the situation wherein electrically conductive probe member 14 is connected to a ground. Positive current will flow in electrical circuit B from conductor 30 through forward biased diode 48, battery 54, resistor 50, and forward biased light emitting diode 52 to conductor 28. Any current leakage through electrical circuit A will be minimal. The components of electrical circuit B are selected such that the input impedance of circuit B is less than 100 ohms, and preferably in the range of 20 to 30 ohms so that only low impedance grounds will provide an indication through light emitting diode 52. High impedance grounds, i.e., those having several hundred ohms resistance, or higher, will not draw enough current from battery 54 to illuminate light emitting diode 52.

From the above description, it can be appreciated that the present invention provides a self-contained hand-held pocket probe for testing of DC electrical systems, particularly, systems having a maximum voltage in the range of 6 to 24 volts. Most of the disadvantages of the prior art systems are eliminated in that the pocket probe of the present invention incorporates a self-contained battery power supply which is effective for relatively long periods of time before replacement since the circuit characteristics are such that quiescent leakage current is minimal. Additionally, the pocket probe of the present invention is specifically designed to detect low impedance loads which are critical in certain applications, such as automotive electrical systems. In addition, the pocket probe may be used with systems having a maximum test voltages in a wide range of 6 to 24 volts as opposed to many prior art test probes which are limited in their capacity.

What is claimed is:

1. A self-contained switchless hand-held portable pocket probe for electrical trouble shooting of direct current systems, comprising:
   (a) electrically conductive probe means for connection to a test point;
   (b) ground terminal means for connection to a reference ground potential;
   (c) first circuit means connected between said probe and said ground terminal for normally enabling positive current flow therethrough only in the direction from said probe to said ground terminal, said first circuit means comprising a first illumination circuit having a first illumination device and means for limiting the current flow through said first illumination device, said first circuit means further comprising a first impedance means and a first rectifying device connected in series with said first illumination circuit;
   (d) second circuit means connected between said probe and said ground terminal and parallel with said first circuit means for normally enabling positive current flow therethrough only in the direction from said ground terminal to said probe said second circuit means comprising a second illumination device, a second rectifying device, a second impedance means, and a battery connected to provide positive current flow in a direction toward said probe, said first and second circuit means defining a loop circuit, said first and second illumination devices, said first and second illumination devices, said first and second rectifying devices, and said first and second impedance means selected to provide a quiescent leakage current of not greater than 4 microamps in said loop circuit, and said first impedance means selected to have an impedance substantially greater than the impedance of said second impedance means; and (e) a housing in which said probe, said ground terminal and said first and second circuit means are mounted, said housing adapted to be inserted in a pocket when not in use and sized to be hand-held.

2. A self-contained portable pocket probe in accordance with claim 1 wherein said current limiting means further comprises a plurality of serially connected diodes connected in parallel with said first illumination device, said diodes normally enabling positive current flow only in the direction from said probe to said ground terminal, said diodes operable to limit the maximum voltage drop across said first illumination device.

3. A self-contained portable pocket probe in accordance with claim 2 wherein said second circuit means has an input impedance measured from said ground terminal to said probe the maximum value of which is approximately 100 ohms whereby only low impedance measurements between said test point and said reference ground potential will activate said second illumination device.

4. A self-contained portable pocket probe in accordance with claim 3 wherein said first circuit means further comprises a resistance means for dissipating substantially all of the voltage difference between the voltage at the test probe and the voltage across said current limiting means.

5. A self-contained portable pocket probe in accordance with claim 4 wherein said first and second illumination devices comprise light emitting diodes.

6. A self-contained portable pocket probe in accordance with claim 1 wherein said current limiting means is a zener diode connected in parallel with said first illumination device.

7. A self-contained portable pocket probe in accordance with claim 6 wherein said second circuit means has an input impedance measured from said ground terminal to said probe with a maximum value of approximately 100 ohms whereby only low impedance measurements between said test point and said reference ground potential will activate said second illumination device.

8. A self-contained portable pocket probe in accordance with claim 7 wherein said first circuit means further comprises a resistance means for dissipating substantially all of the voltage difference between the voltage at said probe and the voltage across said zener diode.

9. A self-contained portable pocket probe in accordance with claim 8 wherein said first and said second illumination devices are light emitting diodes.

10. A self-contained switchless hand-held portable pocket probe in accordance with claim 1 wherein said first impedance means is selected to have an impedance at least ten times greater than the impedance of said second impedance means.

11. A self-contained switchless hand-held portable pocket probe for electrical trouble shooting of direct current systems, comprising:

(a) electrically conductive probe means for connection to a test point;

(b) ground terminal means for connection to a reference ground potential;

(c) first circuit means connected between said probe and said ground terminal for normally enabling positive current flow therethrough only in the direction from said probe to said ground terminal, said first circuit means comprising a first illumination circuit having a first illumination device and means for limiting current flow through said first illumination device, said first circuit means further comprising a first impedance means and a first rectifying device in series with said first illumination circuit;

(d) second circuit means connected between said probe and said ground terminal and parallel with said first circuit means for normally enabling positive current flow therethrough only in the direction from said ground terminal to said probe, said second circuit means comprising a second illumination device, a second rectifying device, a second impedance means, and a battery connected to provide positive current flow in a direction toward said probe, said second circuit means having an input impedance measured from said ground terminal to said probe not exceeding approximately 100 ohms whereby only low impedance measurement between said test point and said reference ground potential will activate said second illumination device, said first impedance means selected to have an impedance substantially greater than the impedance of said second impedance means; and (e) a housing in which said probe, said ground terminal, said first and second circuit means are mounted, said housing adapted to be inserted in the pocket when not in use and sized to be hand-held.

12. A self-contained switchless hand-held portable pocket probe in accordance with claim 11, wherein said input impedance of said second circuit means is in the range of 20–30 ohms.

13. A self-contained switchless hand-held portable pocket probe in accordance with claim 11 wherein said first and second circuit means define a loop circuit, said first and second illumination devices, said first and second rectifying devices, and said first and second impedance means are selected to provide a quiescent leakage current of not greater than 4 microamps in said loop circuit.

* * * * *